(12) United States Patent
Ference et al.

(10) Patent No.: US 6,611,050 B1
(45) Date of Patent: Aug. 26, 2003

(54) CHIP EDGE INTERCONNECT APPARATUS AND METHOD

(75) Inventors: Thomas G. Ference, Essex Junction, VT (US); Wayne J. Howell, Williston, VT (US); William R. Tonti, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/538,636

(22) Filed: Mar. 30, 2000

(51) Int. Cl.$^7$ ............................................. H01L 23/02
(52) U.S. Cl. ........................................ 257/679; 257/678
(58) Field of Search .................... 257/679, 723–724, 257/778–779, 780, 781, 784, 786, 774, 620; 358/482, 483, 513, 514

(56) References Cited

U.S. PATENT DOCUMENTS

| | | | |
|---|---|---|---|
| 4,021,838 A | | 5/1977 | Warwick .................... 257/777 |
| 4,772,951 A | | 9/1988 | Saito .......................... 358/482 |
| 4,990,462 A | * | 2/1991 | Sliwa, Jr. ................... 438/107 |
| 5,031,072 A | | 7/1991 | Malhi et al. ................ 361/706 |
| 5,071,792 A | | 12/1991 | VanVonno et al. ............ 438/17 |
| 5,075,253 A | * | 12/1991 | Sliwa, Jr. |
| 5,126,286 A | * | 6/1992 | Chance ...................... 438/462 |
| 5,196,652 A | * | 3/1993 | Mikkelsen, Jr. et al. |
| 5,204,925 A | | 4/1993 | Bonanni et al. ............. 385/89 |
| 5,229,647 A | * | 7/1993 | Gnadinger |
| 5,373,189 A | * | 12/1994 | Massit et al. |
| 5,401,672 A | | 3/1995 | Kurtz et al. ................ 438/107 |
| 5,421,908 A | * | 6/1995 | Yoshida et al. |
| 5,439,849 A | * | 8/1995 | McBride et al. |
| 5,454,160 A | * | 10/1995 | Nickel |
| 5,606,198 A | * | 2/1997 | Ono et al. |
| 5,632,631 A | * | 5/1997 | Fjelstad et al. ............... 439/82 |
| 5,668,409 A | * | 9/1997 | Gaul |
| 6,069,973 A | * | 5/2000 | Lin et al. .................... 382/167 |

FOREIGN PATENT DOCUMENTS

DE 19704955 A1 * 8/1998 ................... 79/77

OTHER PUBLICATIONS

Wolf, "Silicon Processing for the VLSI Era, vol. 2—Process Integration," 1990, Lattice Press, vol. 2, pp. 273–275.*
Mahajan et al. Concise Encyclopedia of Semiconducting Materials & Related Technologies First Edition 1992, Permagon Press, p. 95.*
Multichip–On–Flex Plastic Encapsulated MHDI–Low Cost Substratesless Manufacturing for Microwave and Millimeterwave Modules, Cooper et al, 1996 IEEE MTT–S Digest, pp. 219–225.

* cited by examiner

Primary Examiner—Nathan J. Flynn
Assistant Examiner—Kevin Quinto
(74) Attorney, Agent, or Firm—Schmeiser, Olsen & Watts; Anthony Canale

(57) ABSTRACT

The present invention provides a method of forming a low profile chip interconnection, and the interconnection so formed. A recessed contact area is formed at an edge of the wafer. A conductive material is deposited within the adjacent contact areas of each recess, thereby electrically connecting the two chips. The recess may have substantially perpendicular sides, or sloped sides.

16 Claims, 19 Drawing Sheets

CHIP EDGE INTERCONNECT APPARATUS AND METHOD

BACKGROUND OF THE INVENTION

1. Technical Field

The present invention relates generally to the manufacture of integrated circuits, and more particularly, to a method of forming a low profile chip-to-chip connection.

2. Related Art

Electronic devices commonly referred to as VLSI, which stands for very large scale integration, require extremely low profile chip connections to ensure the formation of a compact device in some applications. For example, smart cards contain important information, such as the balance of a person's bank account, health information, etc., in a device that is the size of a credit card. Therefore, smart cards require extremely low profile connections to combine the microprocessor, memory, controller, flash memory chip, display, etc., within such a small package. Similarly, low profile connections are required within a CCD (charge coupled device) camera focal plane because the CCD must be positioned as close as possible to the shutter to minimize distortions. Other applications for low profile connections include such devices as other large-field radiation detectors in which numerous chips are combined within a flat array, and mixed substrate systems, such as SOI (silicon-on-insulator) logic and SiGe RF (silicon germanium radio frequency) chips for analog front-end feeding for digital processors.

In these examples, low profile connections are extremely useful for several reasons. Primarily low profile connections are important when overall height of the chip assembly must be minimized. In addition, low profile connections allow subsequent chemical layers of the structure to be more uniformly deposited over the surface of the device, since smaller bumps or non-uniformities are produced.

Currently used techniques, such as wire bonding and surface mounting, occupy too much space for use in a compact device, such as a smart card. Accordingly, there exists a need in the industry for a chip interconnection apparatus that solves the above problems.

SUMMARY OF THE INVENTION

The present invention provides a VLSI chip interconnection apparatus, and a method of forming the same. In particular, the chip interconnection provides a recessed contact area located at the edge of each chip.

The first general aspect of the present invention provides a semiconductor chip connection structure, comprising: a recess within an edge of a first chip and an edge of a second chip, wherein each recess includes a contact area; and a connection between the contact areas of the first and second chips. This aspect provides a low profile chip connection.

The second general aspect of the present invention provides a method of forming a chip-to-chip connection, comprising the steps of: providing a semiconductor wafer, having a dicing channel therein; forming a recess within the wafer at the location of the dicing channel; separating the wafer along the dicing channel to form two chips; and forming a connection within the recess between mating chips. This aspect provides similar advantages as those associated with the first aspect.

The third general aspect of the present invention provides a device including at least two chips connected via an edge connection. This aspect provides a device, such as a smart card, or CCD camera, that utilizes the edge connection structure of the first two embodiments.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein:

FIG. 16c depicts a cross-sectional view of the structure of another embodiment of the invention;

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiment. Although the drawings are intended to illustrate the present invention, the drawings are not necessarily drawn to scale.

Figure 1:
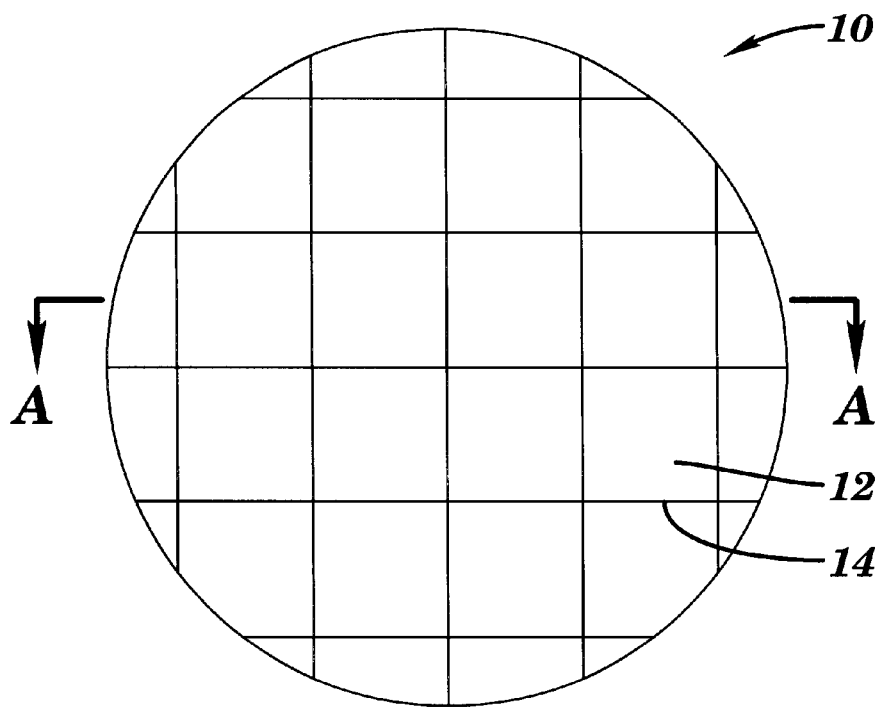
FIG. 1 depicts a top view of a semiconductor wafer, in accordance with a preferred embodiment of the present invention.
Figure 2:
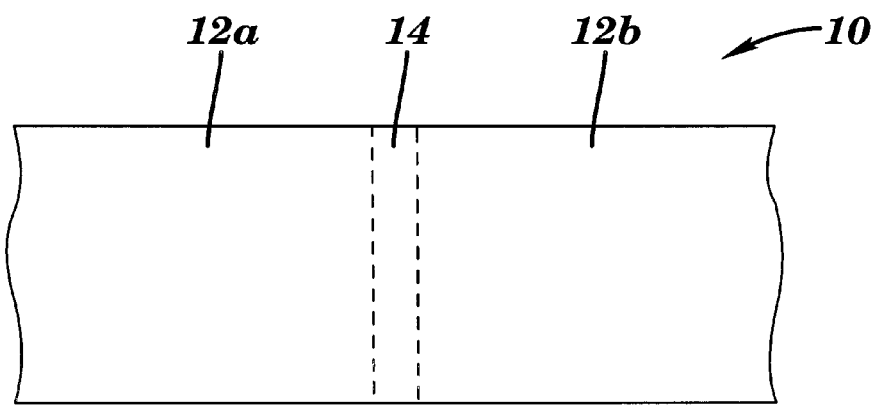
FIG. 2 depicts a cross-sectional of the wafer of FIG. 1 along line A—A, in accordance with a preferred embodiment of the present invention.

Referring to the drawings, FIG. 1 shows a top view of a semiconductor wafer 10, preferably a silicon wafer, having a plurality of dies or chips 12 formed therein. Each chip 12 of the wafer 10 is separated by a dicing channel 14 (the dicing channel being the designated location of actual dicing, which is performed during a subsequent step). The chips 12 are separated by techniques known and used in the industry, such as cutting the wafer 10 with a narrow saw blade. FIG. 2 shows a cross-sectional view of the wafer 10 taken along line A—A of FIG. 1, wherein two chips 12a and 12b are separated by the dicing channel 14.

Figure 3:
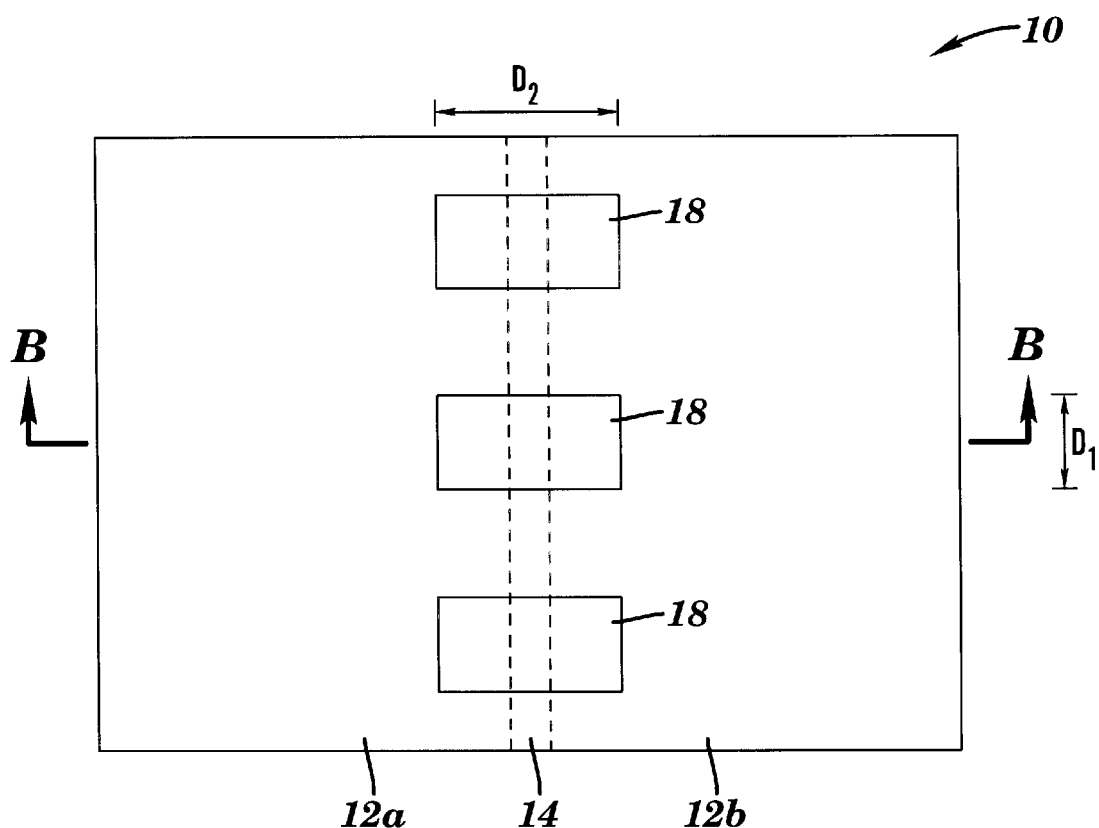
FIG. 3 depicts a top view of the wafer of FIG. 2 having three Shallow Trench Isolation (STI) regions formed therein, in accordance with a first embodiment of the present invention.
Figure 4:
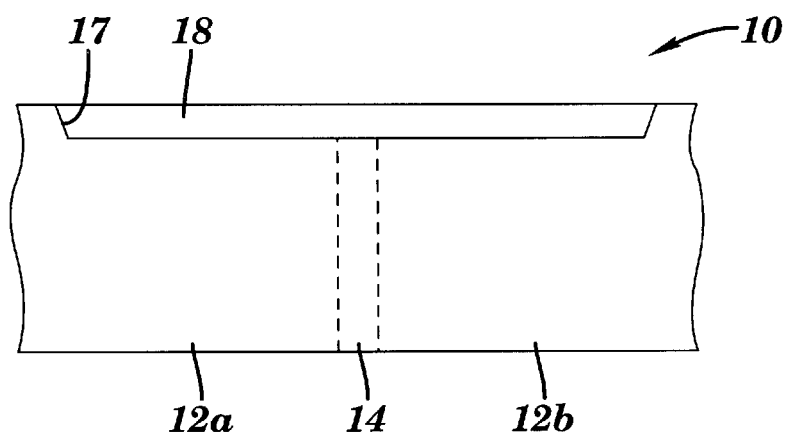
FIG. 4 depicts a cross-sectional view of the wafer of FIG. 3 along line B—B, in accordance with a first embodiment of the present invention.

In a first embodiment, during front-end-of-line (FEOL) processing, a plurality of shallow trench isolation (STI) regions 18 are formed on the wafer 10, in this example three STI regions 18 are formed as shown in FIG. 3. In particular, each STI region 18 is preferably formed by first depositing a layer of photoresist (not shown) over the surface of the wafer 10, exposing the photoresist, and etching the wafer 10. The trench 17 formed by the etch is then filled with a dielectric material, such as an oxide, to form the STI region 18 shown in FIG. 4, wherein FIG. 4 is a cross-sectional view of the wafer 10 taken along line B—B. To ensure a uniform surface for subsequent process steps, the wafer 10 is then planarized using a conventional planarizing process, such as a chemical-mechanical polishing (CMP) process.

Each STI region 18 is preferably formed having a first dimension D1 of approximately 100 $\mu$m, and a second dimension D2 of approximately 200–275 microns (refer to FIG. 3). Although it is desirable to minimize the dimensions D1, D2, as much as possible to reduce the overall size of the device, minimum dimensions D1, D2 are required in the subsequent structure for the containment of the conductive material which forms the connection between adjacent chips (described in more detail infra). Each STI region 18 is preferably centered over the dicing channel 14.

Figure 5:
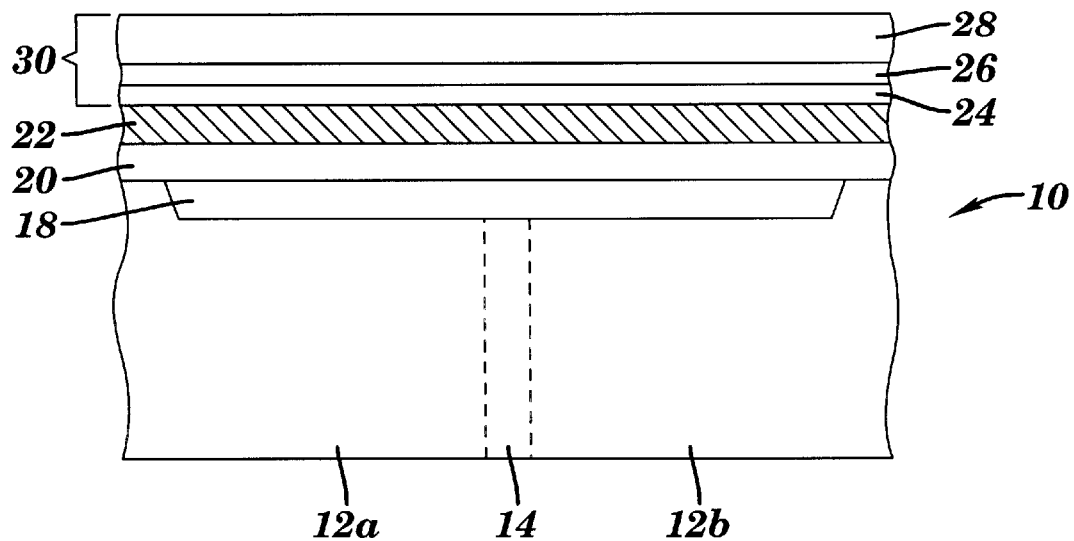
FIG. 5 depicts a cross-sectional view of the wafer of FIG. 4 having several layers thereon, in accordance with a first embodiment of the present invention.

A dielectric layer 20 is formed over the surface of the wafer 10, using known techniques, as shown in FIG. 5. The dielectric layer 20 is preferably composed of an oxide, and has a thickness of approximately 1 $\mu$m. A conductive layer 22 is formed over the dielectric layer 20 using well known techniques, such as plasma-enhanced chemical vapor deposition (PECVD) and/or plating. The conductive layer 22 is preferably composed of a metal, such as copper, however, the conductive layer 22 may be other comparable materials, such as aluminum, tungsten, etc. The conductive layer 22 preferably has a thickness of approximately 1 µm, and is typically the only conductive layer that extends to the contact because it serves as the wiring between the edge connection terminal being formed and the internal chip circuitry. However, for some applications additional intermediate conductive layers may be used in which other wiring and/or contact vias are formed in the edge connection area.

A first dielectric layer 24, preferably an oxide, is deposited over the conductive layer 22, preferably using a chemical-vapor deposition (CVD) technique. A second dielectric layer 26, preferably nitride, is deposited over the first dielectric layer 24, also using CVD techniques. A third dielectric layer 28, preferably polyimide, is deposited over the second dielectric layer 26 using conventional spin-apply techniques. The dielectric stack 30 formed by the first, second and third dielectric layers 24, 26, 28 preferably has a thickness of approximately 2–4 microns. Other dielectric stacks, consisting of different materials, may also be used in other applications.

Figure 6A:
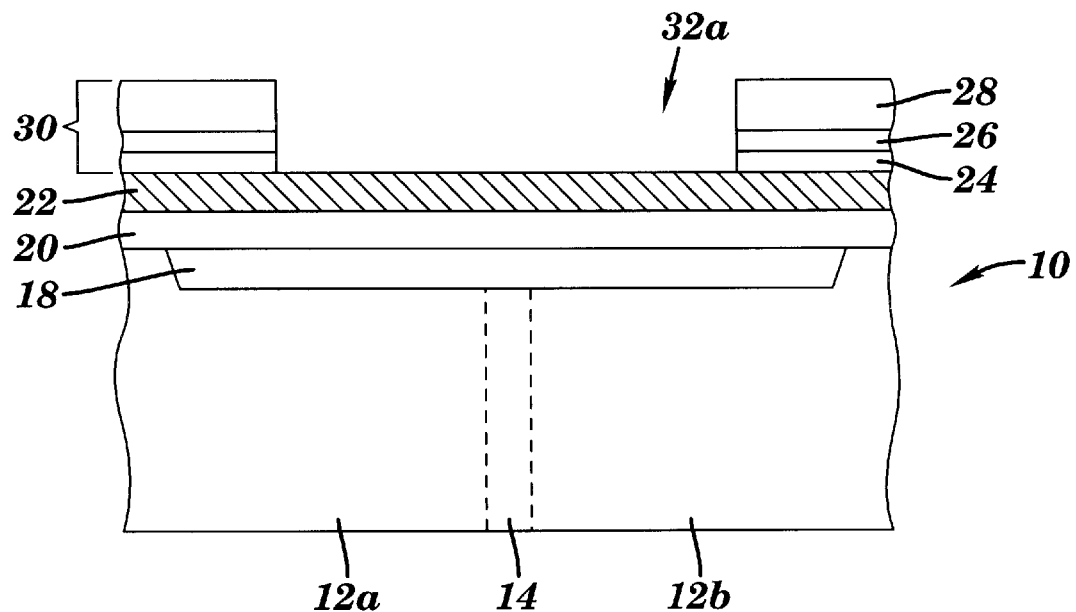
FIGS. 6a depicts a cross-sectional view of the wafer of FIG. 5 having a first opening therein, in accordance with a first embodiment of the present invention.
Figure 6B:
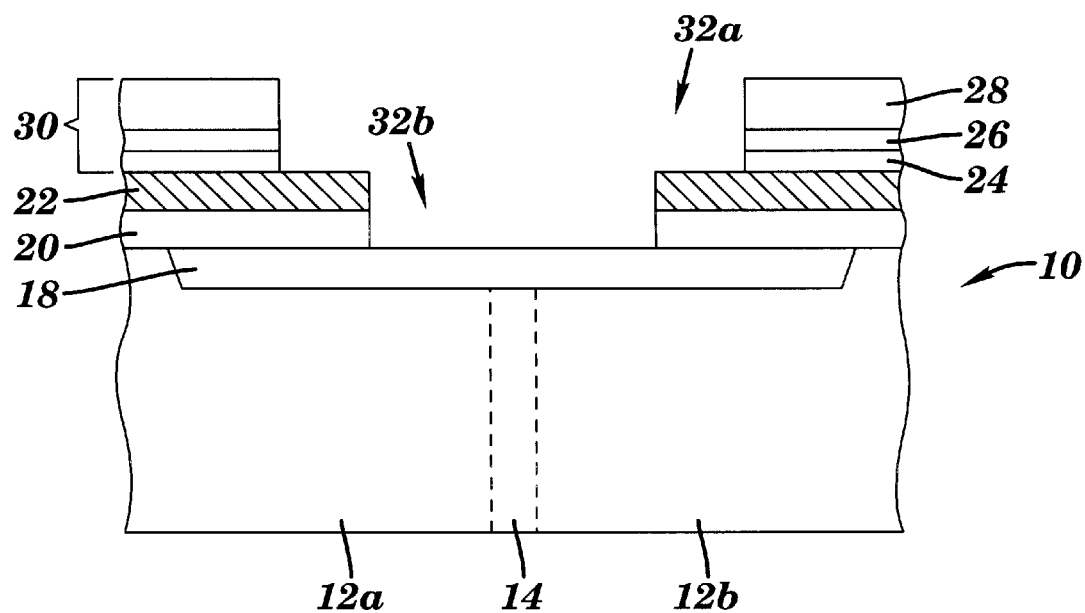
FIG. 6b depicts a cross-sectional view of the wafer of FIG. 5 having a second opening therein, in accordance with a first embodiment of the present invention.

A mask (not shown), preferably patterned photoresist, is formed over the surface of the wafer 10. A selective etch process, preferably a combination of reactive ion etch (RIE) steps, and/or in the alternative chemical etch steps, may be used to remove a portion of the dielectric stack 30 (recess or opening 32a in FIG. 6a). A second mask and etch process forms a narrower recess or opening 32b in the conductive layer 22 and the dielectric layer 20, as illustrated in FIG. 6b. The etch of layer 20 should be timed so as not to penetrate the dielectric material within the STI region 18. Note that the dielectric layer 20 can in some applications be a series of several wiring interlevel dielectric layers, and that the conductive layer 22 can be a wiring layer from any of those available during chip fabrication.

Figure 7:
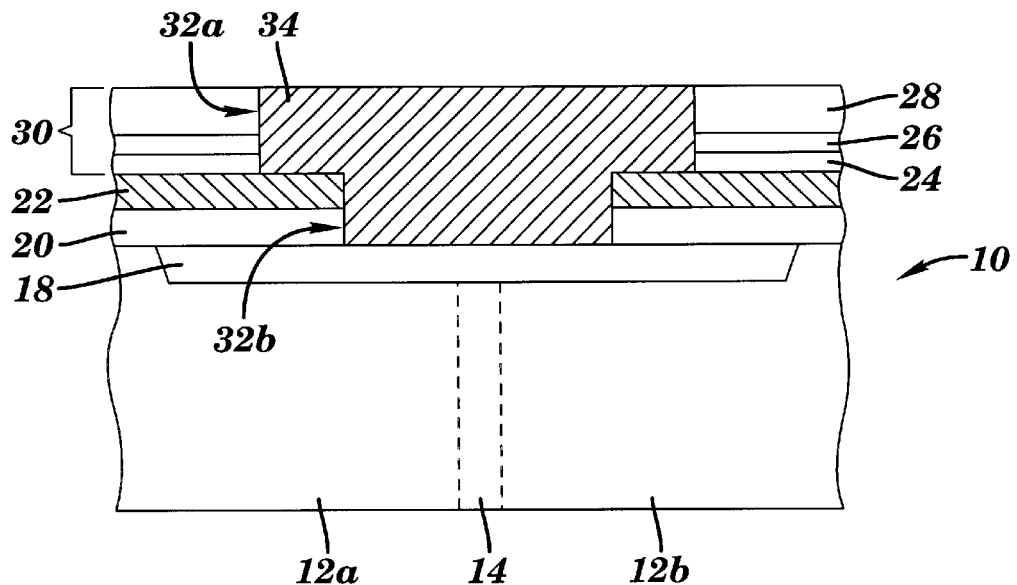
FIG. 7 depicts a cross-sectional view of the wafer of FIG. 6b having a conductive material within the opening, in accordance with a first embodiment of the present invention.

A conducive material 34, preferably solder, is deposited within the openings 32a, 32b, and wets to the exposed regions of the conductive layer 22, as shown in FIG. 7. The solder is preferably deposited using solder injection molding (SIM), as known and used in the industry. The conductive material 34 may also be a solder paste, SuperSolder™ (Furukawa Electric Co. of Japan), etc. In the alternative, the conductive material 34 may be a conductive polymer metal composite (also called "PMC").

Figure 8:
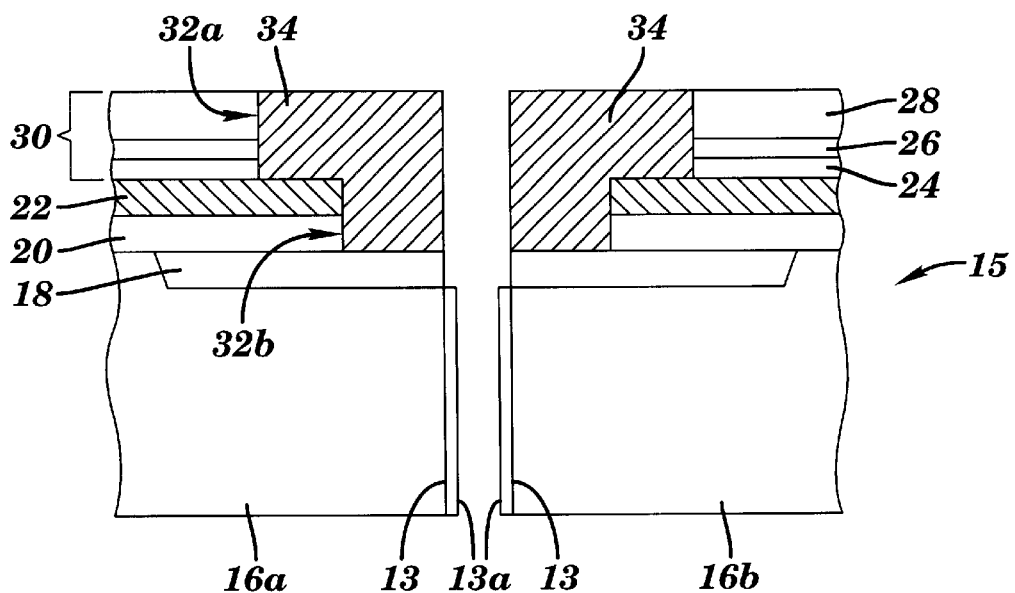
FIG. 8 depicts a cross-sectional view of the wafer of FIG. 7 after dicing, in accordance with a first embodiment of the present invention.
Figure 9:
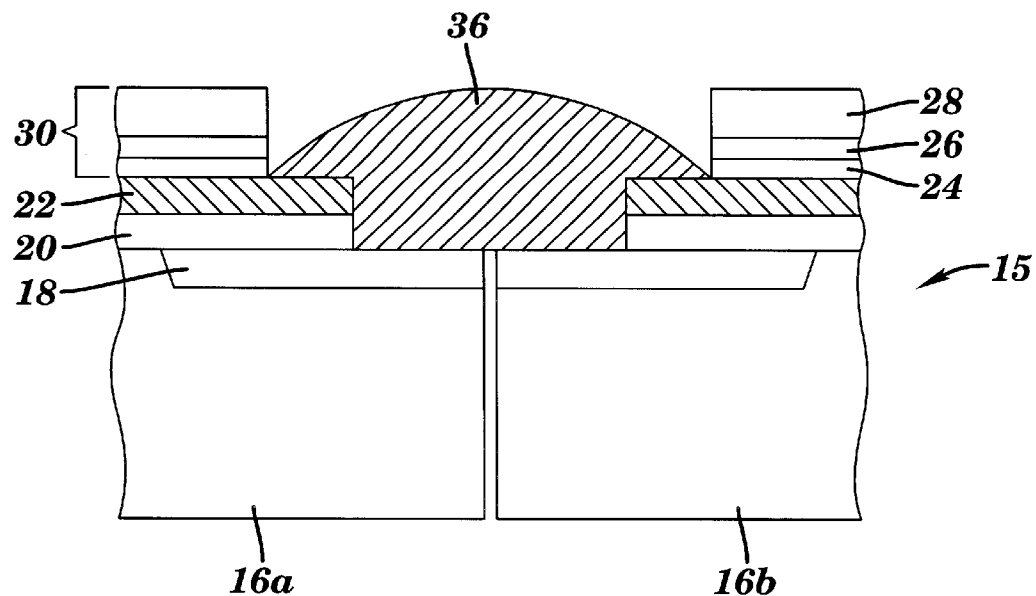
FIG. 9 depicts a cross-sectional view of the connection formed between adjacent chips, in accordance with a first embodiment of the present invention.
Figure 10:
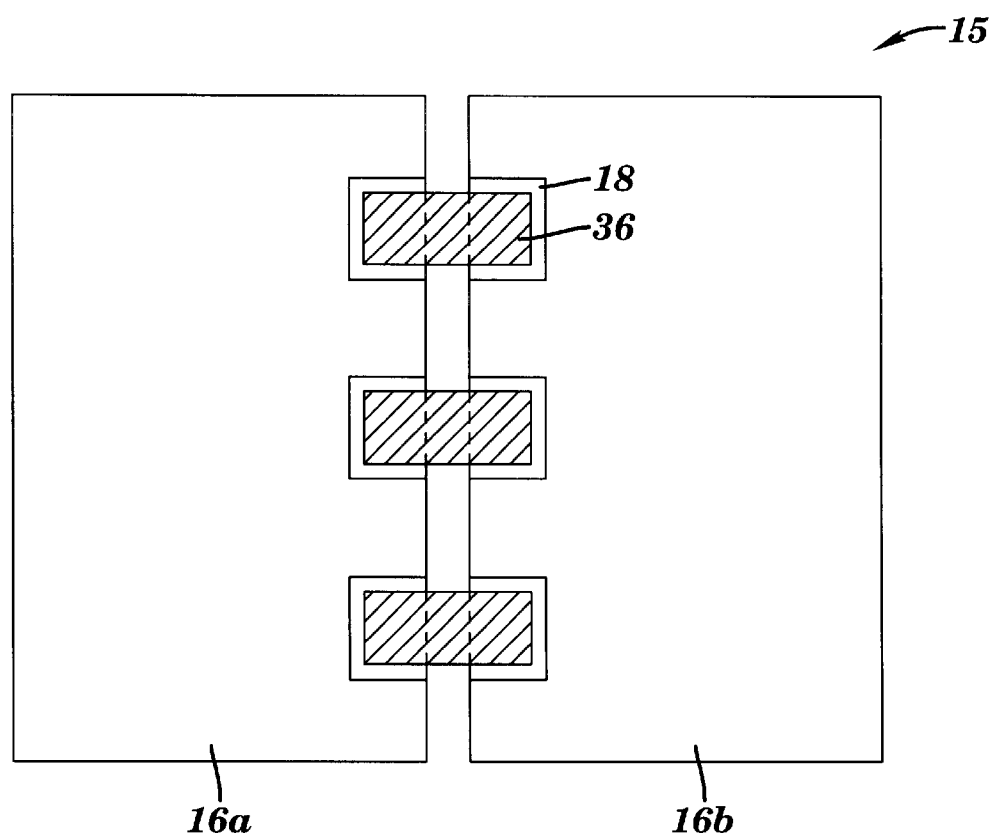
FIG. 10 depicts a top view of FIG. 9, in accordance with a first embodiment of the present invention.

Following the application of the conductive material 34 within the openings 32a, 32b, the wafer 10 is then diced through the dicing channel 14, using conventional dicing techniques, thereby forming two separate chips 16a, 16b, as illustrated in FIG. 8. For instance, diamond saw cutting, laser ablation, etc., may be used to form chips 16a, 16b. An optional dielectric layer 13a, preferably composed of a layer of low temperature oxide or polyimide, may be applied to one or several of the chip edges 13 of the chips 16a, 16b in the event additional chip isolation is required. Chips 16a and 16b, preferably from different wafers, are then mated or placed such that the chip edges 13 are adjacent one another. The chip assembly 15 is then exposed to a low temperature heat cycle to reflow the conductive material 34 within the openings 32a, 32b, thereby forming an interconnection or connection 36, as illustrated in FIG. 9. The temperatures used to reflow the conductive material 34 range from approximately 260° C. to 400° C. FIG. 10 shows a top view of the chip assembly 15 having each of the three connections 36 formed over each of the three STI regions 18.

In the alternative, following the etch step for opening 32b, as illustrated in FIG. 6b, the wafer 10 may be diced before the conductive material 34 is formed in the openings 32a, 32b, thereby forming two individual chips 16a, 16b. The thin dielectric layer 13a may also be optionally deposited therebetween for additional isolation, as described above. Each chip 16a, 16b may be formed by cutting the chips 12a, 12b from the wafer 10 using known precision dicing techniques, e.g., using a narrow circular saw (having a width of approximately 25 µm or less), laser ablation, etc. The edges 13 of the chips 16a, 16b are then mated or placed adjacent one another. A conductive material 34 is placed within the openings 32a, 32b by any of several known methods such as solder injection molding, solder paste or screening, and then reflowed, if necessary, to form the connection 36, as above. Conductive materials, such as PMC, are particularly useful when the solder reflow temperature is too high for the underlying components, namely, when connecting a single chip, or an array of chips, directly to a smart card. This provides either a permanent connection, similar to solder, or a temporary connection which enables functionality checks of the chips. Furthermore, these "soft" conductive pastes may be used for the connection of components having mismatched thermal coefficients of expansion, such as, the connection between a microprocessor (which requires high temperatures) and a DRAM (which requires low temperatures).

Figure 11:
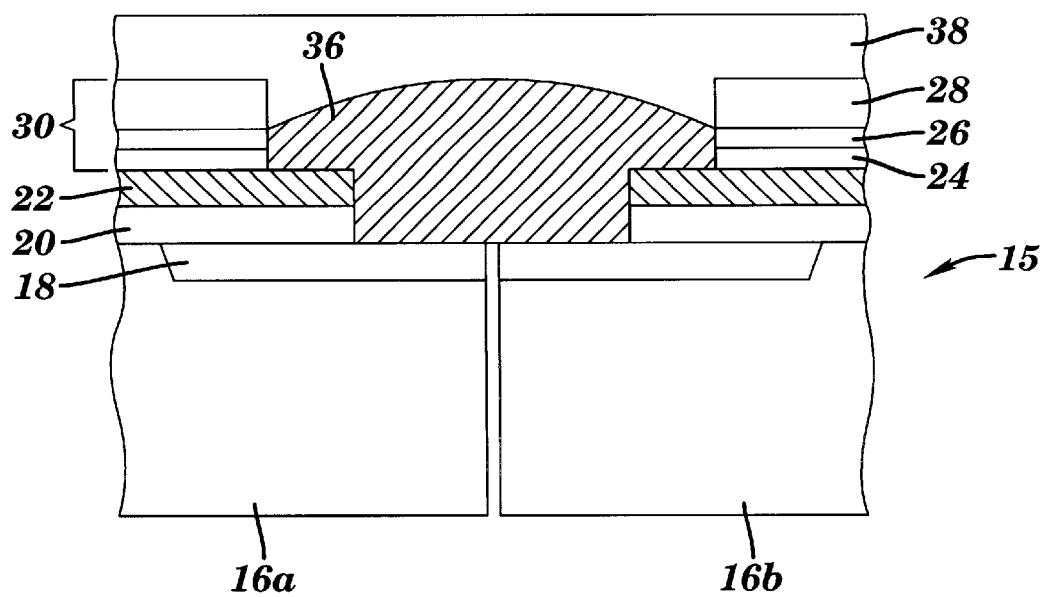
FIG. 11 depicts a cross-sectional view of the wafer of FIG. 9 having an encapsulant thereon, in accordance with a first embodiment of the present invention.

An encapsulant 38, preferably polyimide, is formed over the surface of the chip assembly 15 and each connection 36, such that the encapsulant 38 coats the surface of the chip assembly 15 with a relatively planar protective layer, as depicted in FIG. 11. The encapsulant 38 is preferably deposited via spin-apply techniques, having a thickness of approximately 10–20 µm. The encapsulant 38 provides the chip assembly 15 with mechanical protection, i.e., protection against scratching, as well as acting as a moisture barrier.

Figure 12:
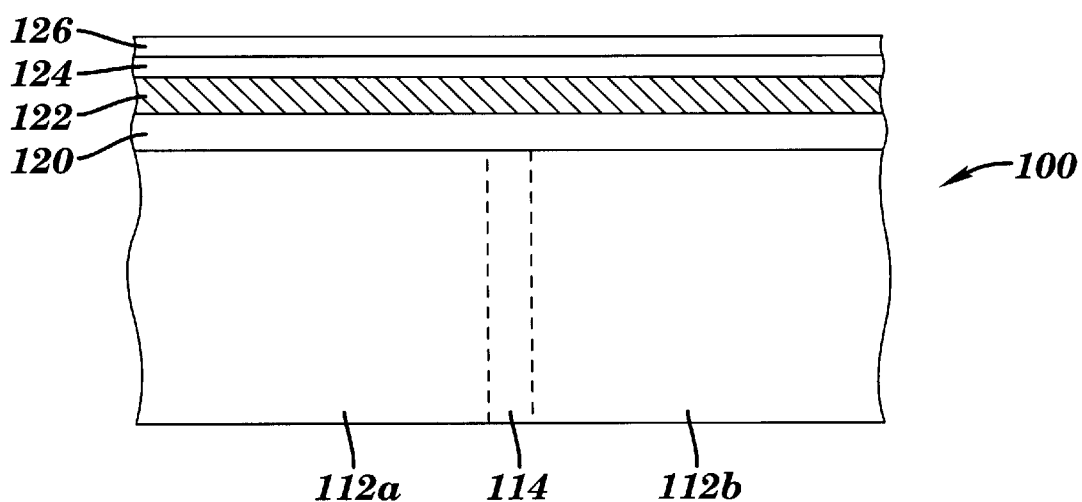
FIG. 12 depicts a cross-sectional view of a wafer having several layers thereon, in accordance with a second embodiment of the present invention.
Figure 13:
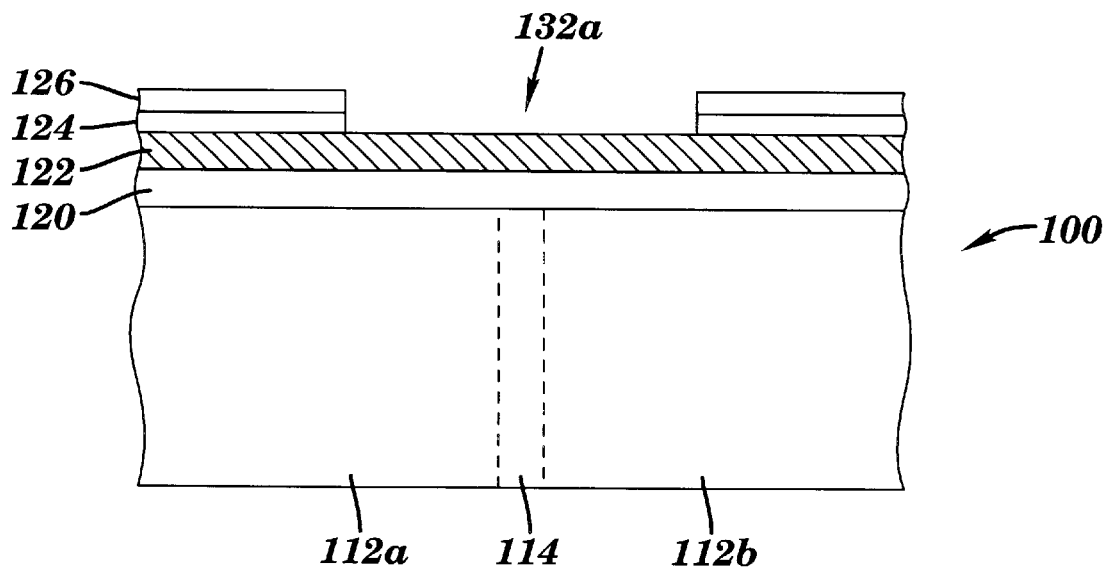
FIG. 13 depicts a cross-sectional view of the wafer of FIG. 12 having several layers patterned and selectively etched therein, in accordance with a second embodiment of the present invention.
Figure 14:
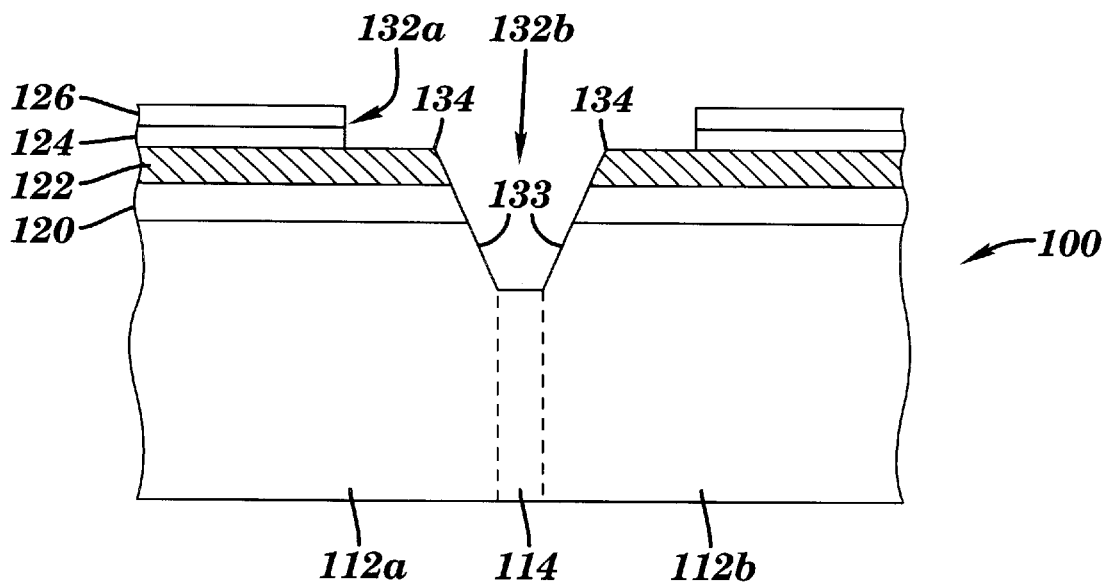
FIG. 14 depicts a cross-sectional view of the wafer of FIG. 13 having a trench formed therein, thereby exposing a conductive layer, in accordance with a second embodiment of the present invention.

In a second embodiment, the trench or recess 132 may be formed having sloped sides 133. As shown in FIG. 12, a dielectric layer 120, a conductive layer 122, and a first and second dielectric layer 124, 126, are deposited over a wafer 100 having two chips 112a, 112b separated by a dicing channel 114 (the dicing channel being the designated location of actual dicing, which will be performed during a subsequent step). The dielectric layer 120, conductive layer 122, and first and second dielectric layers 124, 126, are preferably similar materials, and deposited in a similar manner as those associated with the first embodiment. Note that other dielectric stack combinations besides 124 and 126 may be used, and that the dielectric layer 126 and conductive layer 122 are representations of any chip wiring layer and interlevel dielectric layer. The wafer 100 is masked (not shown) and selectively etched, as described in the previous embodiment, to remove a portion of the first and second dielectric layers 124, 126, forming an opening 132a, which exposes a portion of the conductive layer 122, as shown in FIG. 13. The top side of the wafer 100 is then cut, using a shallow (2–3 mil.) angled blade to form the V-shaped recess or opening 132b, as shown in FIG. 14.

Figure 15:
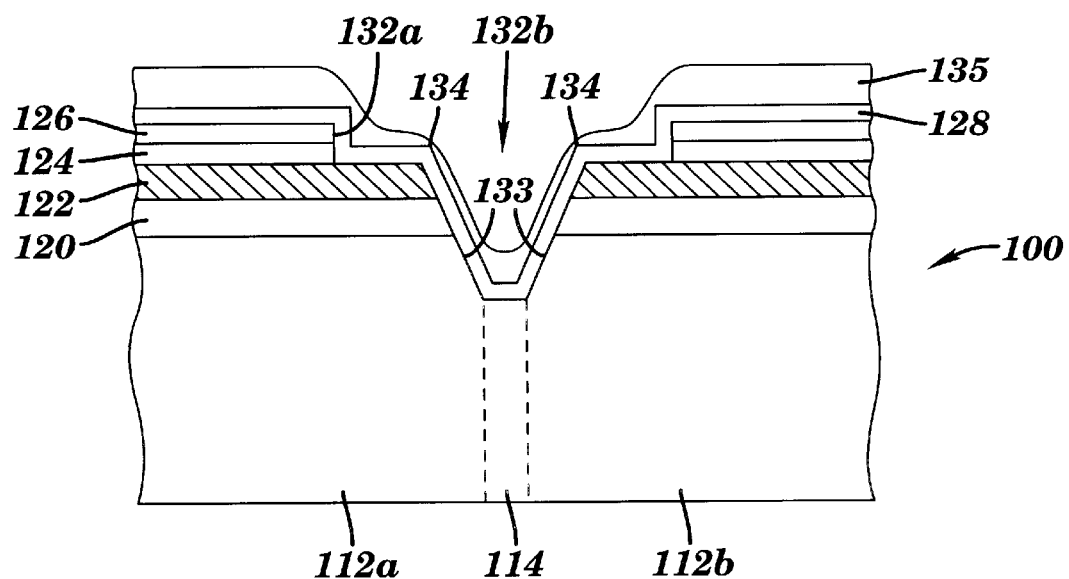
FIG. 15 depicts a cross-sectional view of the wafer of FIG. 14 having a resist thereover, in accordance with a second embodiment of the present invention.
Figure 16A:
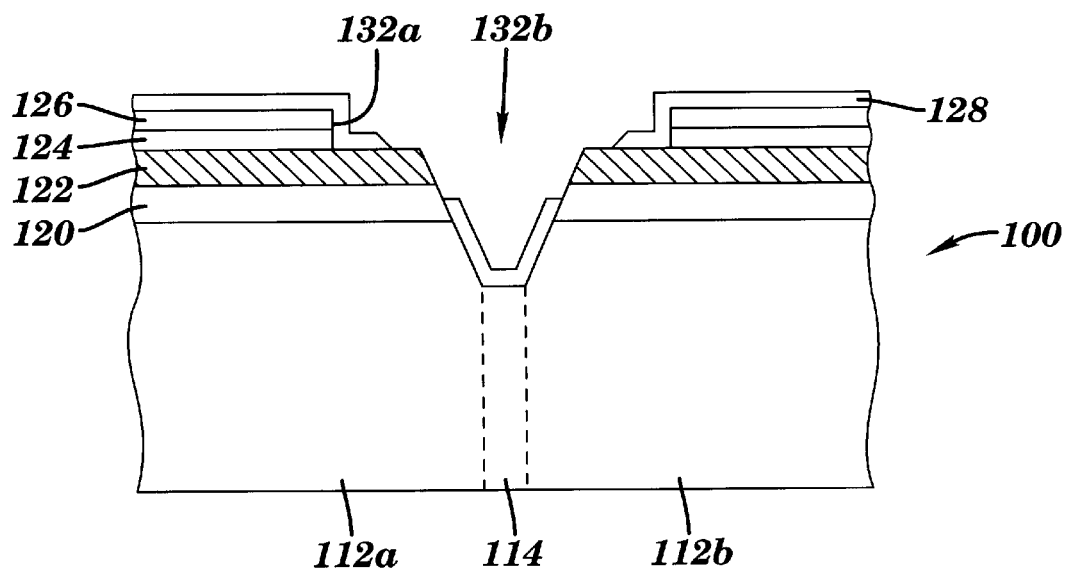
FIGS. 16a and 16b depict a cross-sectional view of the wafer of FIG. 15 having the conductive layer exposed (16a), abd with the addition of a conductive material (16b) in accordance with a second embodiment of the present invention.
Figure 16B:
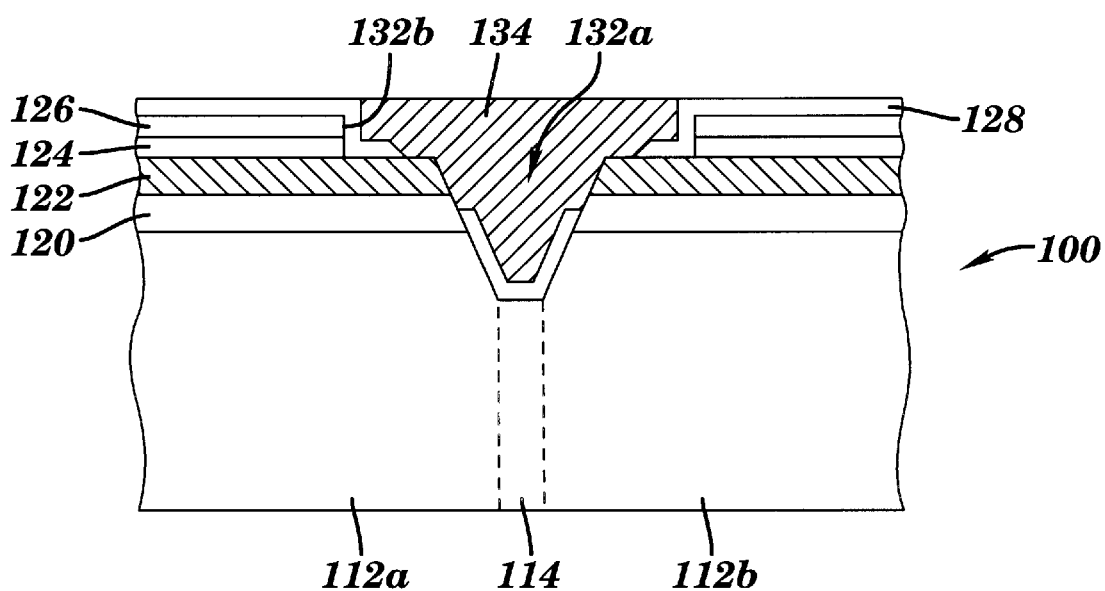
Figure 17:
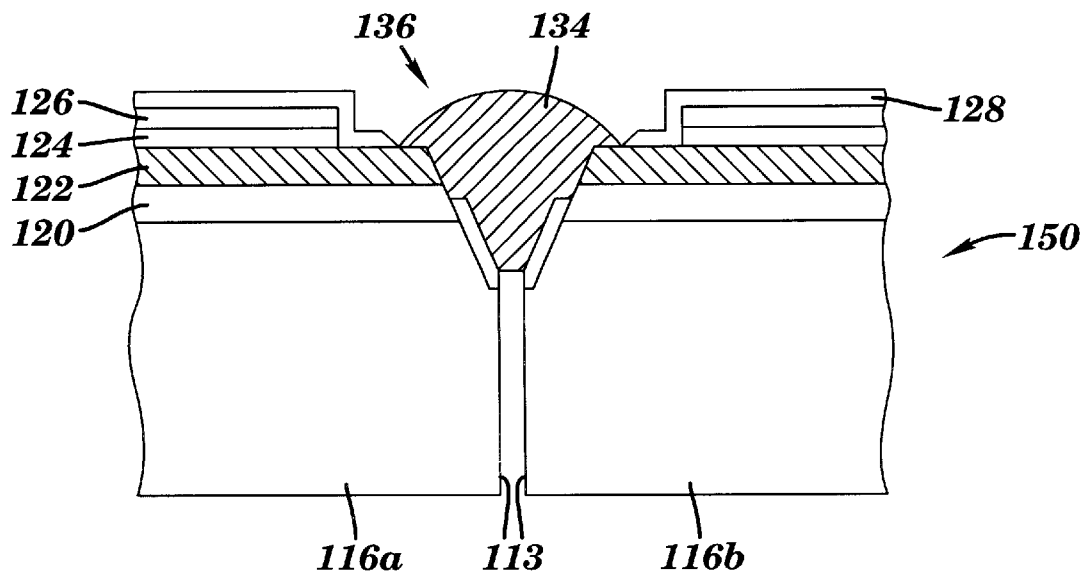
FIG. 17 depicts a cross-sectional view of the wafer of FIG. 16b having a connection formed between adjacent chips, in accordance with a second embodiment of the present invention.

A third dielectric layer 128 is deposited over the surface of the wafer 100, as shown in FIG. 15. The third dielectric layer 128 uniformly coats the exposed surfaces of the wafer 100. A layer of resist 135 is applied over the third dielectric layer 128 using known deposition techniques. Because of the sloped sides 133 and sharp corners 134, the resist 135 does not coat the structure uniformly. The layer of resist 135 is partially developed, namely at the corners 134 where the resist. 135 is the thinnest. The surface of the wafer 100 is then selectively etched to expose the third dielectric layer 128 covering the conductive layer 122. The remainder of the layer of resist 135 is then removed using a conventional stripping process, as shown FIG. 16a. As illustrated in FIG. 16b, a conductive material 134 (such as the solder materials previously mentioned), is applied within the openings 132a, 132b of the wafer 100. The wafer 100 is then diced into chips 116a and 116b. The chips 116a, 116b are then mated and connected, via a reflow process (similar to the process discussed above), to form a chip assembly 150 having a connection 136, as illustrated in FIG. 17.

As mentioned in the first embodiment, following the etch step, the wafer 100 may be diced at that time, thereby forming two individual chips 116a, 116b prior to the deposition of the conductive material 134. An optional chip edge dielectric (not shown) analogous to 13a (FIG. 8) may be applied at this time if desired or needed. The edges 113 of the chips 116a, 116b may then mated or placed adjacent one another. The conductive material 134 may then placed within the openings 132a, 132b, and reflowed to form the connection 136 within the chip assembly 150, as shown in FIG. 17.

The angled or sloped sides 133 of the V-shaped opening 132b (see FIG. 14) may be sloped in the range of approximately 45–55 degrees. Formation of the sloped sides 133 allows the opening 132b to be formed deeper within the wafer 100, which aids in producing a compact device.

In a third embodiment, edge connections 236 are formed between two chips 216a, 216b, wherein the conductive layer 222 is formed adjacent the dicing channel 214 (the dicing channel being the designated location of actual dicing, which will be performed during a subsequent step).

Figure 18:
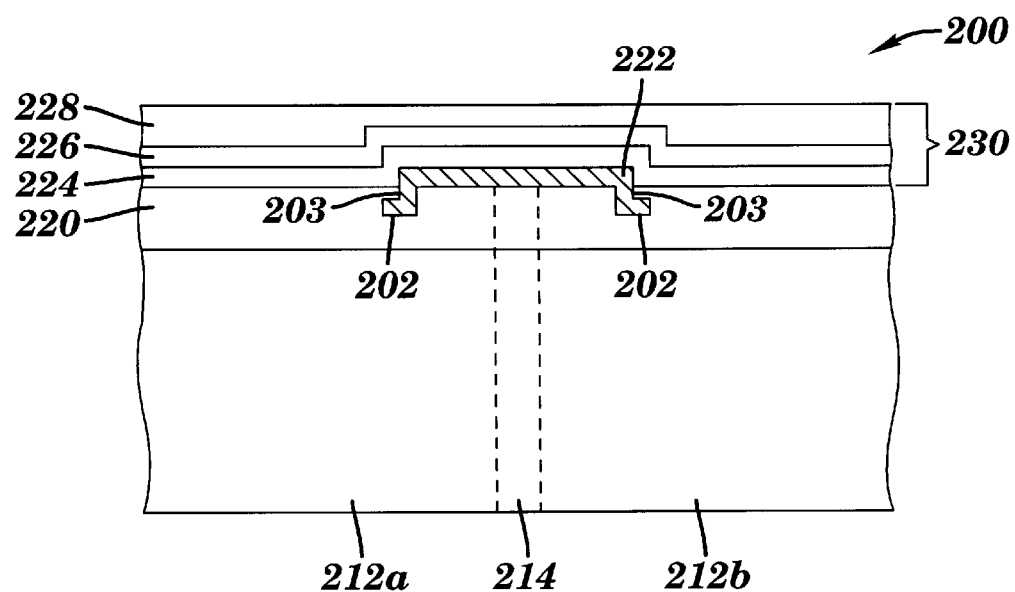
FIG. 18 depicts a cross-sectional view of a wafer having several layers formed thereon, in accordance with a third embodiment of the present invention.
Figure 19:
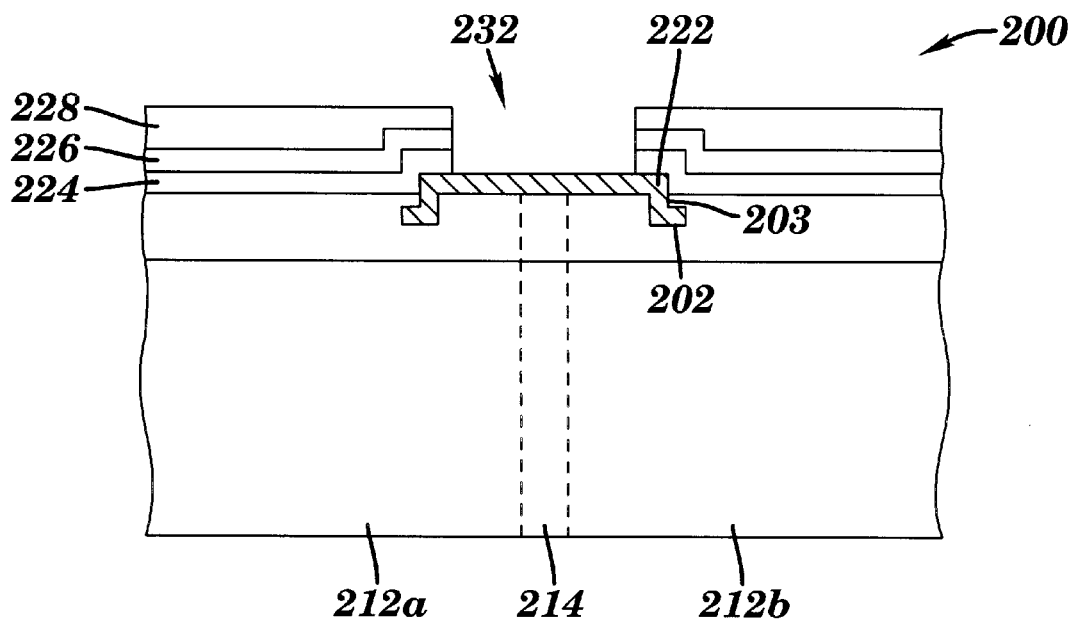
FIG. 19 depicts a cross-sectional view of the wafer of FIG. 18 having an opening therein, in accordance with a third embodiment of the present invention.

As depicted in FIG. 18, a wafer 200 contains two chips 212a, 212b separated by a dicing channel 214. A dielectric layer 220 is deposited over the wafer 200, as described in the first embodiment. A metal line 202 and vias 203 are formed within the dielectric layer 220 using a conventional wiring process. A conductive layer 222 is deposited over the dielectric layer 220, contacting the vias 203 and metal line 202. A dielectric stack 230, comprising a first, second and third dielectric layer 224, 226, 228, respectively, is deposited over the conductive layer 222 in a manner similar to that of the first embodiment. The dielectric stack 230 is masked, patterned and etched to form a shallow recess or opening 232, as shown in FIG. 19, which exposes the conductive layer 222.

Figure 20:
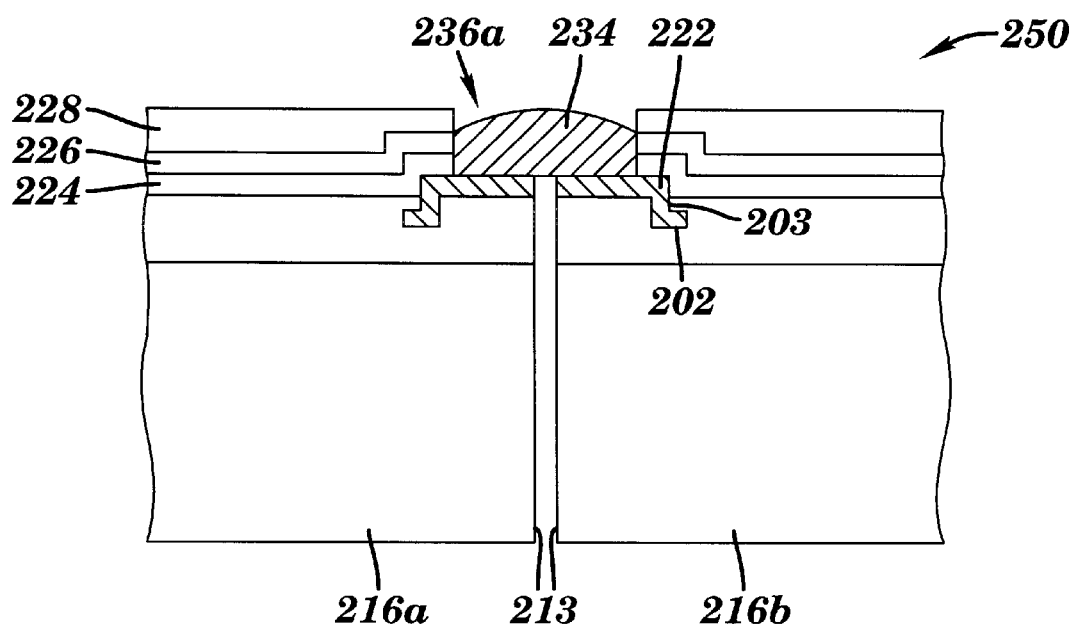
FIG. 20 depicts a cross-sectional view of the wafer of FIG. 19 having a connection formed between adjacent chips, in accordance with a third embodiment of the present invention.

The wafer 200 is then diced along the dicing channel 214 to form two chips 216a, 216b. The edges 213 of other individual chips 216a, 216b are mated, and a conductive material 234 is placed on the conductive layer 222 within the recess 232. The conductive material 234 is reflowed to form the chip assembly 250 having a connection 236a therein, as depicted in FIG. 20.

Figure 21:
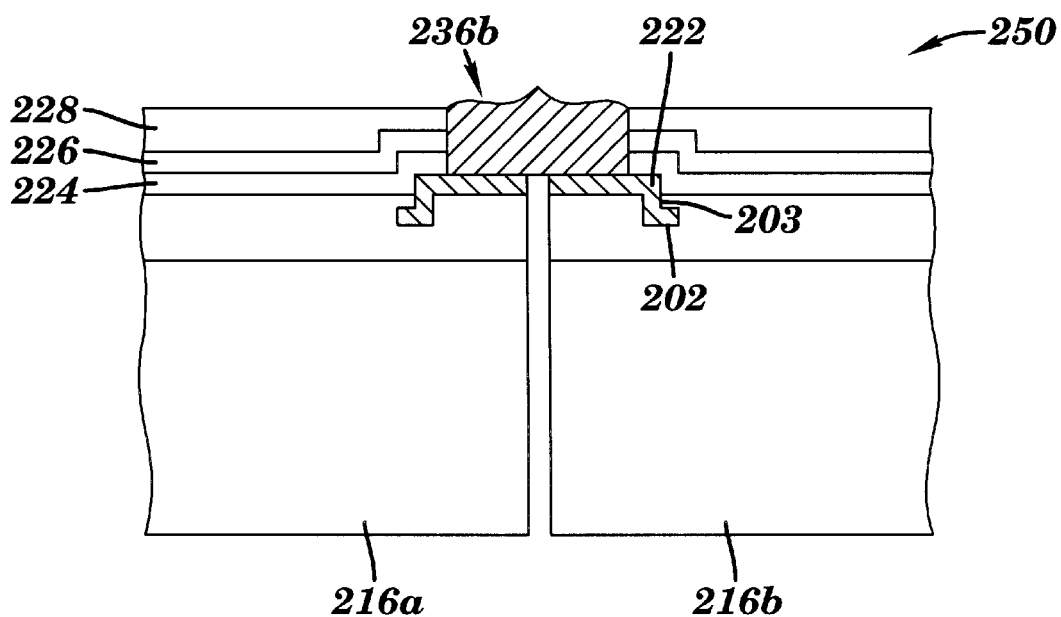
FIG. 21 depicts a cross-sectional view of the wafer of FIG. 19 having a connection formed between adjacent chips, in accordance with a variation of the third embodiment of the present invention.
Figure 22:
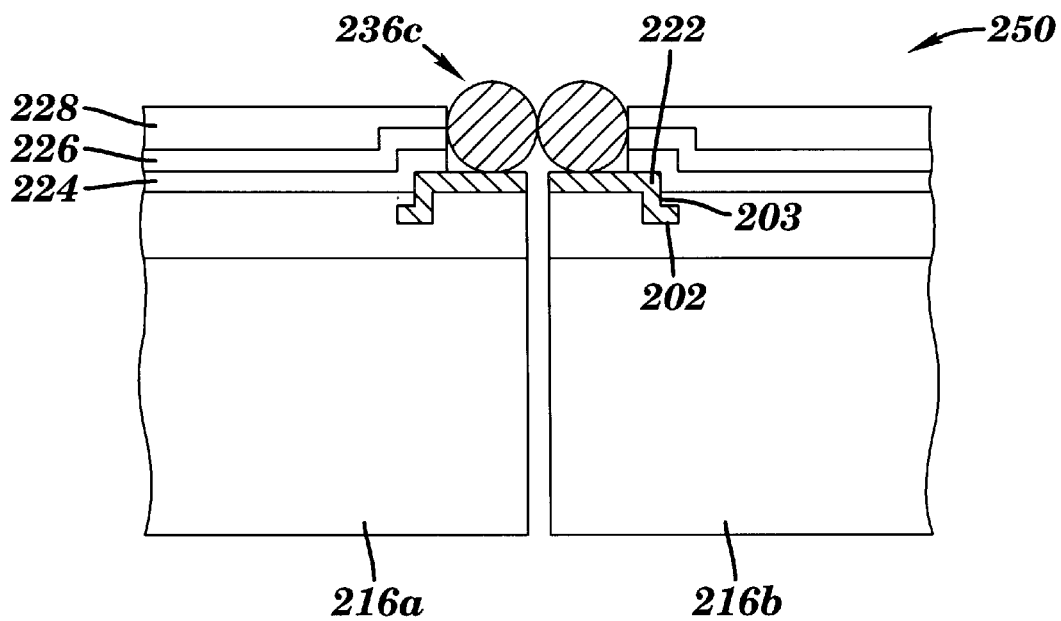
FIG. 22 depicts a cross-sectional view of the wafer of FIG. 19 having a connection formed between adjacent chips, in accordance with a variation of the third embodiment of the present invention.

Additional techniques may be used, in conjunction with the third embodiment, to form the connection 236. For example, after dicing the wafer 200 a wirebond ball (not shown) may be placed over the adjacent portions of the exposed conductive layer 222 within the recess 232. The wirebond ball is then reflowed to form the connection 236b within the chip assembly 250, as depicted in FIG. 21. Similarly, controlled-column-collapse-connections (C4) may be formed within the recess 232 (the process described in more detail herein) producing the connection 236c illustrated in FIG. 22. Furthermore, a plurality of small solder pieces (not shown) may be placed within the recess 232 and a vacuum, applied from below, pulls the solder pieces into the recess 232. Excess solder pieces are then swept away, and the chip assembly 250 is exposed to a low temperature to reflow the solder pieces, forming a connection similar to the connection 236a depicted in FIG. 20.

As mentioned in the first and second embodiments, the wafer 200 may be diced to form two individual chips 216a, 216b immediately following the etch step. An optional edge dielectric similar to 13a (FIG. 8) may be applied at this time. The edges 213 of the chips 216a, 216b may then mated or placed adjacent one another. The conductive material 234 may then be placed within the recess 232, and reflowed (if necessary) to form the connection 236.

Figure 23:
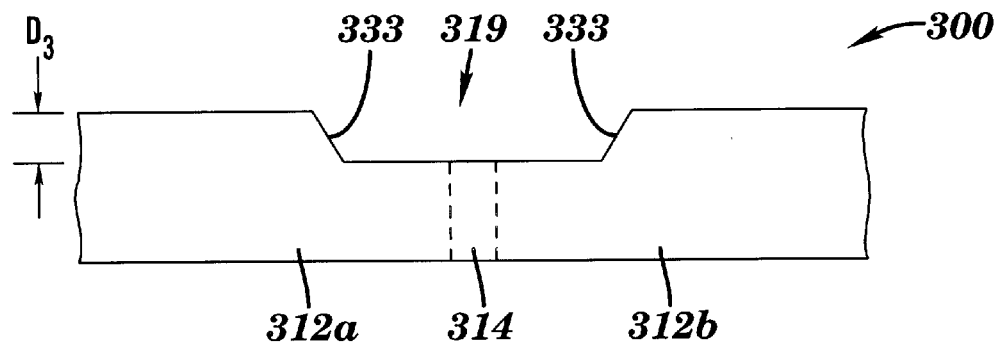
FIG. 23 depicts a cross-sectional view of a wafer having a trench therein, in accordance with a fourth embodiment of the present invention.

In a fourth embodiment, FIG. 23 shows a wafer 300, having two chips 312a, 312b separated by a dicing channel 314 (the dicing channel being the designated location of actual dicing, which will be performed during a subsequent step). Using conventional masking and etching techniques, a recess or opening 319 is formed within the wafer 300 using a potassium hydroxide (KOH) etch. The opening 319, preferably centered over the dicing channel 314, is formed having sloped sides 333. The opening 319 is typically etched to a depth D3 approximately equal to the height of a standard Controlled Collapse Chip Connections (C4) ball, about 100–125 $\mu$m.

Figure 24:
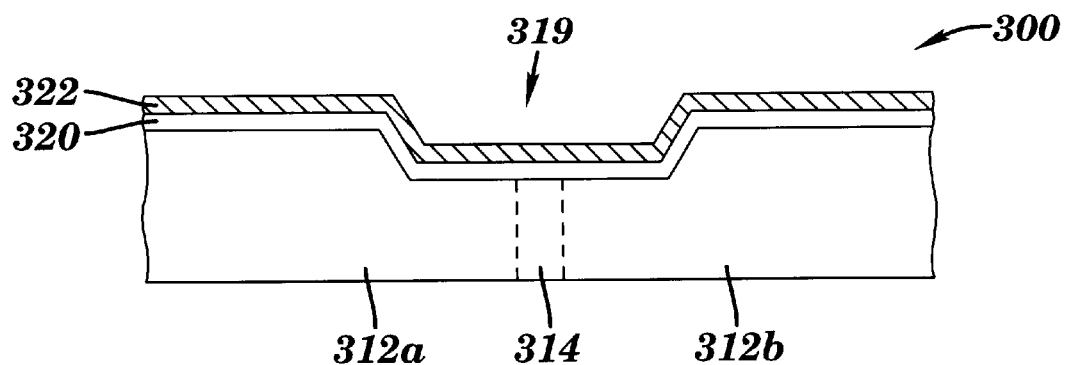
FIG. 24 depicts a cross-sectional view of the wafer of FIG. 23 having several layers thereon, in accordance with a fourth embodiment of the present invention.
Figure 25:
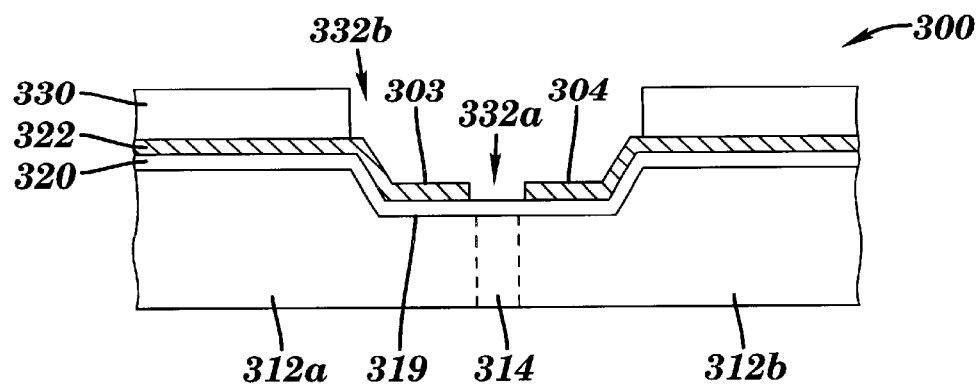
FIG. 25 depicts a cross-sectional view of the wafer of FIG. 24 having a dielectric thereon, in accordance with a fourth embodiment of the present invention.

As shown in FIG. 24, a first dielectric layer 320 is deposited over the surface of the wafer 300. A conductive layer 322 is deposited over the dielectric layer 320 using deposition techniques similar to those described in the first embodiment. An opening 332a is etched in the conductive layer 322 via known etching techniques, thereby forming a pair of contact surfaces 303 and 304 of the chips 312a and 312b, respectively, as shown in FIG. 25. A dielectric stack 330 (composed of similar materials as those described in the previous embodiments) is deposited over the conductive layer 322, using similar techniques as were used in the first embodiment. The dielectric stack 330 is then patterned to form an opening 332b. The opening 332b is preferably approximately the same size as the widest part of the recess 319, therefore, the mask used to form the recess 319 may also be used to form the opening 332b, if desired.

Figure 26:
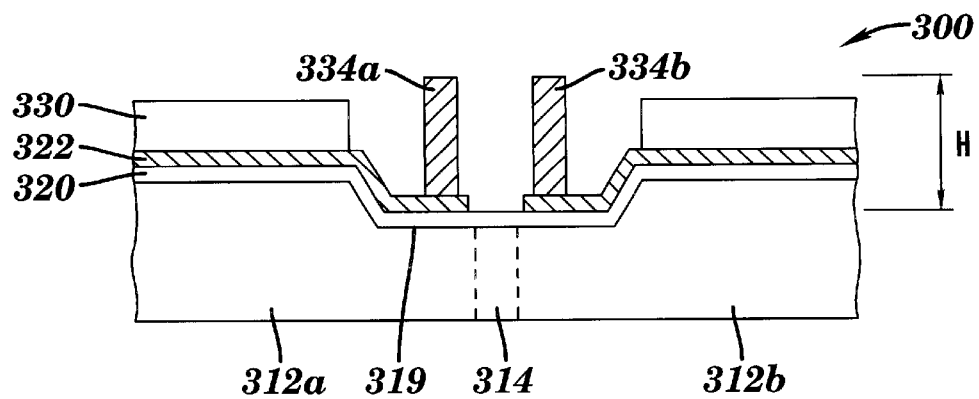
FIG. 26 depicts a cross-sectional view of the wafer of FIG. 25 having solder columns thereon, in accordance with a fourth embodiment of the present invention.
Figure 27:
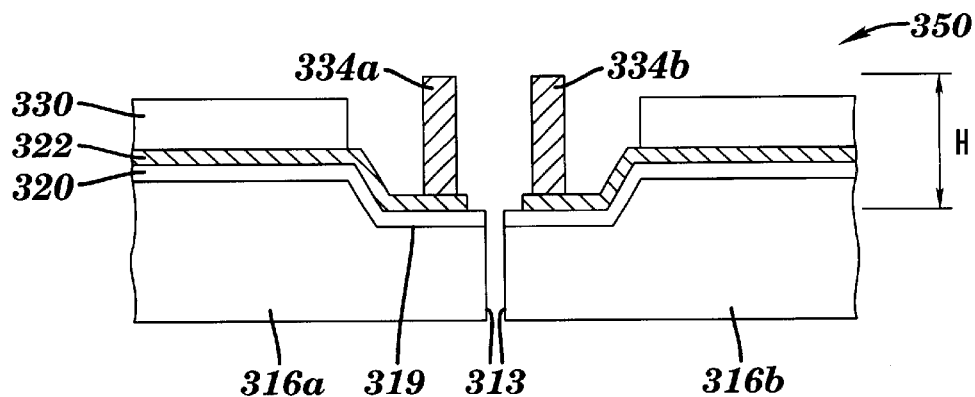
FIG. 27 depicts a cross-sectional view of the wafer of FIG. 26 after dicing, in accordance with a fourth embodiment of the present invention.
Figure 28:
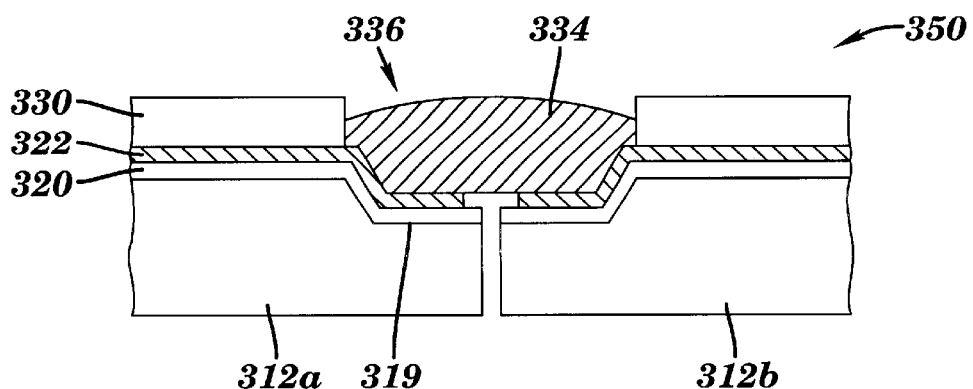
FIG. 28 depicts a cross-sectional view of the wafer of FIG. 27 having a connection formed between adjacent chips, in accordance with a fourth embodiment of the present invention.

A pair of solder columns 334a and 334b are deposited on the contact surfaces 303, 304 of the conductive layer 322, as shown in FIG. 26. The solder columns 334a and 334b are preferably deposited at a height H of approximately 100 $\mu$m, using known deposition techniques. The wafer 300 is then diced along the dicing channel 314 to form individual chips 316a and 316b, using precision dicing methods. The edges 313 of chips 316a and 316b are placed adjacent one another, as shown in FIG. 27. The two chips 316a, 316b are then exposed to a low temperature reflow heat cycle, as known in the art, to reflow the solder columns 334a and 334b, thereby forming a chip assembly 350 having a C4 solder connection 336, as illustrated in FIG. 28.

Figure 29:
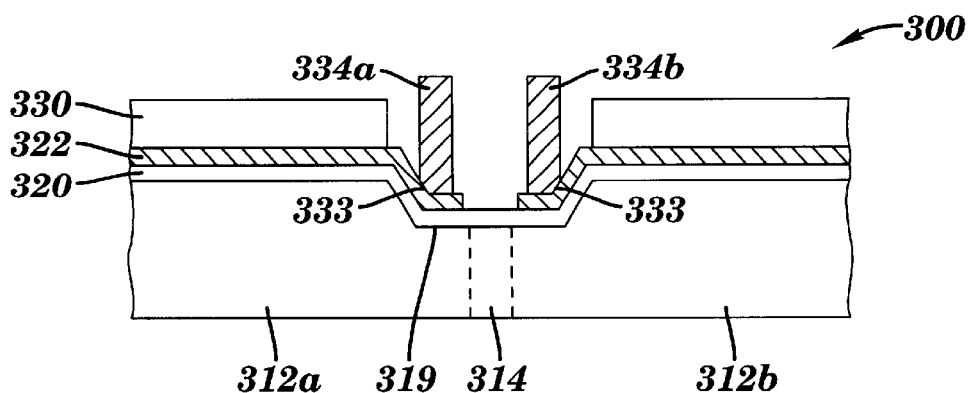
FIG. 29 depicts a cross-sectional view of the wafer of FIG. 25 having solder columns thereon, in accordance with a variation of the fourth embodiment of the present invention.
Figure 30:
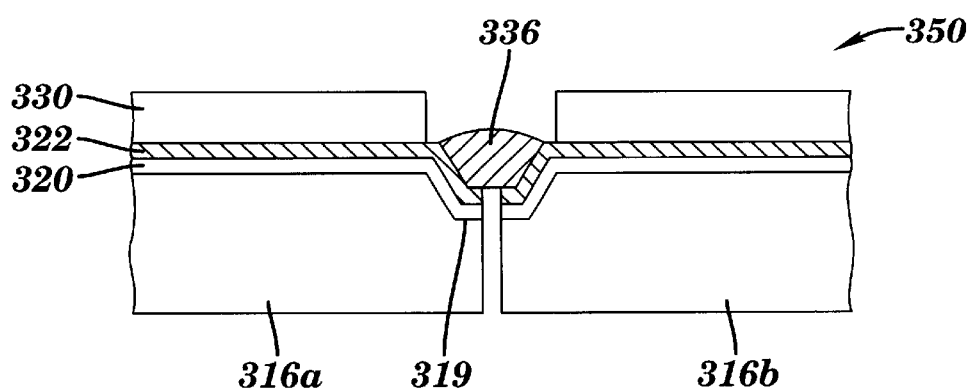
FIG. 30 depicts a cross-sectional view of the wafer of FIG. 29 having a connection formed between adjacent chips, in accordance with a variation of the fourth embodiment of the present invention.

In the alternative, the solder columns 334a and 334b may be deposited on the sloped sides 333 of the recess 319, as depicted in FIG. 29. The wafer 300 is then diced along the dicing channel 314. The dicing process is a precision dicing technique which involves a back side partial cut and a front side cut, using a narrow blade or laser ablation. The profiled edges 313 of the chips 316a, 316b are placed adjacent one another, and the chip assembly 350 is exposed to the low temperature reflow heating process, as mentioned above, to form the C4 solder connection 336 within the recess 319, as illustrated in FIG. 30. This alternative has the advantage of minimizing the chip-to-chip spacing required for the connection 336.

Figure 31:
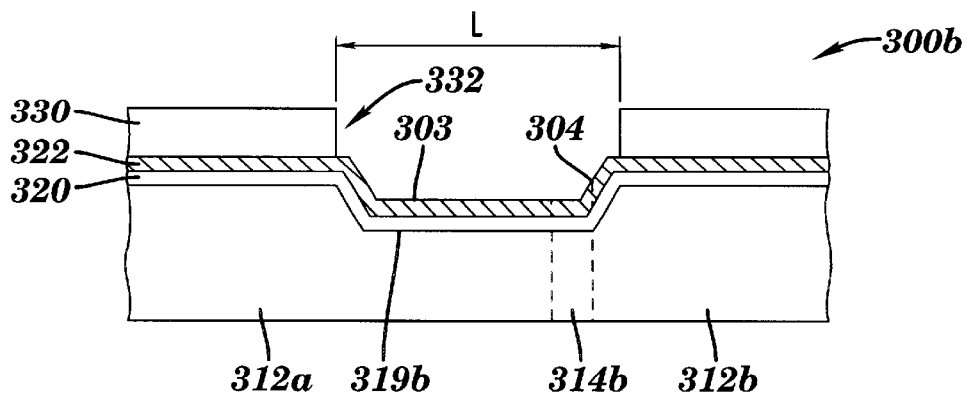
FIG. 31 depicts a cross-sectional view of a wafer having a cavity therein, in accordance with a variation of the fourth embodiment of the present invention.
Figure 32:
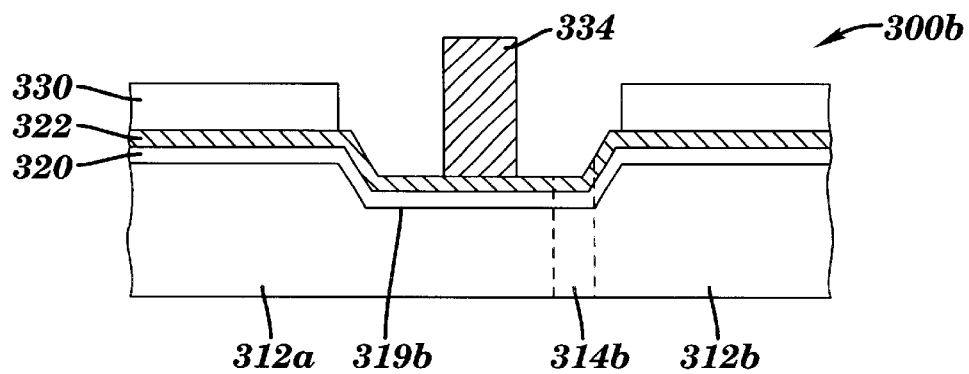
FIG. 32 depicts a cross-sectional view of the wafer of FIG. 31 having a solder column thereon, in accordance with a variation of the fourth embodiment of the present invention.
Figure 33:
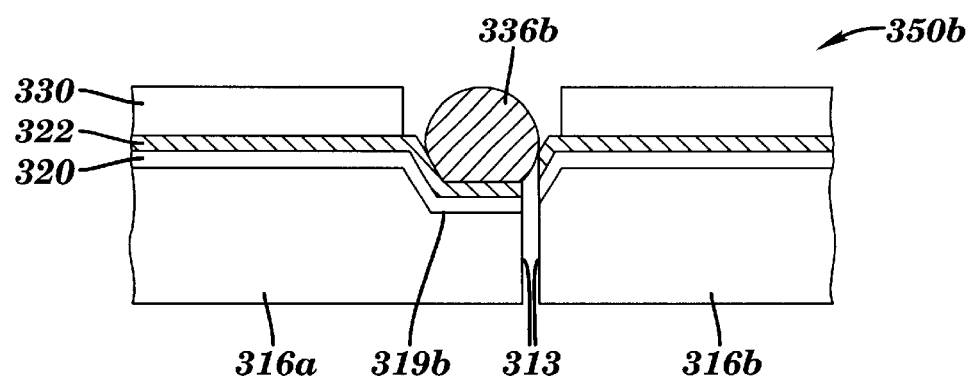
FIG. 33 depicts a cross-sectional view of the wafer of FIG. 32 having a connection formed between adjacent chips, in accordance with a variation of the fourth embodiment of the present invention.

Alternatively, an asymmetric pad layout may be used, wherein the recess 319b is not centered over the dicing channel 314b, as shown in FIG. 31. The length L of the recess 319b may be equal to or less than that of the centered recess 319 discussed above. A single solder column 334 may then be deposited in the recess 319b, as depicted in FIG. 32. The solder column 334 may be the same size and/or volume as the solder columns 334a, 334b, or the solder column 334 may be slightly larger. In the alternative, a pair of solder columns 334a, 334b (similar to.those of FIG. 29) may be deposited within the recess 319b. The wafer 300b is then diced along dicing channel 314b to form chips 316a, 316b. The profiled edges 313 of the two chips 316a, 316b are placed adjacent one another. The solder column 334 is the reflowed to form a chip assembly 350b having a connection 336b, as illustrated in FIG. 33. The solder connection 336b contacts the sloped side 333 of the chip 316b, thereby electrically connecting the metal contact surfaces 303, 304 of the chips 316a, 316b. This alternative has the advantage of further minimizing the chip-to-chip spacing required for the connections 336.

As mentioned in the previous embodiments, the wafer 300 may also be diced to form two individual chips 316a, 316b following the etch step. The edges 313 of the chips 316a, 316b may then mated or placed adjacent one another. The conductive material 334 may then be placed within the recess 332, and reflowed to form the chip assembly 350 having the connection 336.

Figure 34A:
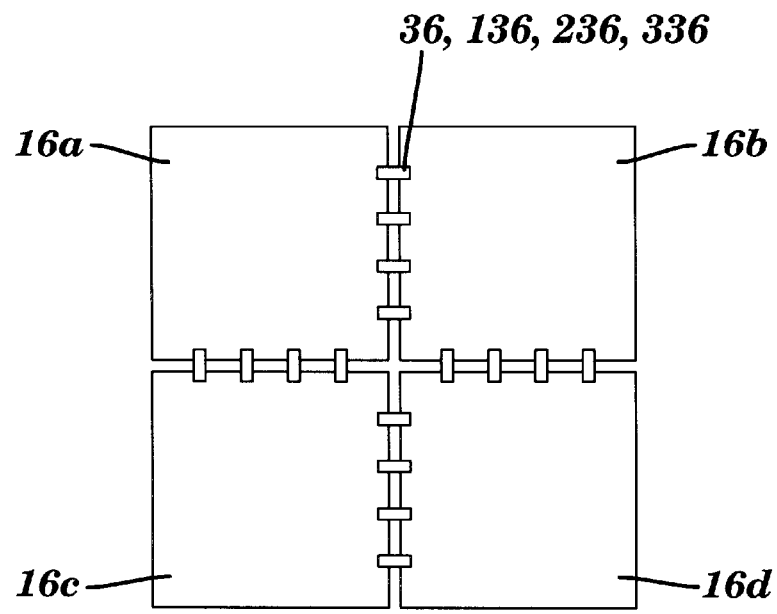
FIG. 34a depicts a top view of several chips connected via edge connections, in accordance with a preferred embodiment of the present invention.
Figure 34B:
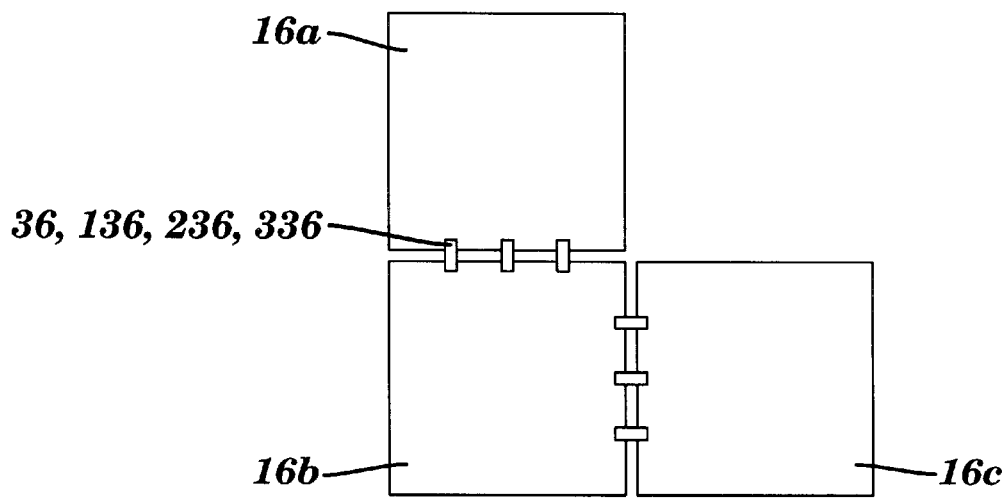
FIG. 34b depicts a top view of several chips connected via edge connections, in accordance with a preferred embodiment of the present invention.

Although illustrated on one side of the chips 16a, 16b, the chip-to-chip connection process may be performed on any and/or all sides of each chip, thereby forming connections 36, 136, 236, 336 between multiple chips 16a, 16b, 16c, 16d, as illustrated in FIG. 34a. Likewise, the present invention is not limited to the method described above, wherein the chips are connected side to side. Rather, the present invention may be used to connect chips in many different configurations. For example, the chips may be connected overlapping one another, at 90° angles, etc. (see FIG. 34b).

It should also be understood that the number of connections made between adjacent chips is shown only as an example, and is in no way intended to limit the scope of the present invention. Furthermore, connection paths may be placed along the sides of chips to "key" adjacent chips. In other words, adjacent surfaces of chips would be designated or marked thereby preventing the problems associated with chip rotations.

It should also be understood that although the present invention was described such that the two chips being connected were adjacent one another while still a part of the wafer, chips from different, non-adjacent regions of the wafer may also be attached to one another. Similarly, chips from different wafers may be attached to one another using the present invention.

Figure 35:
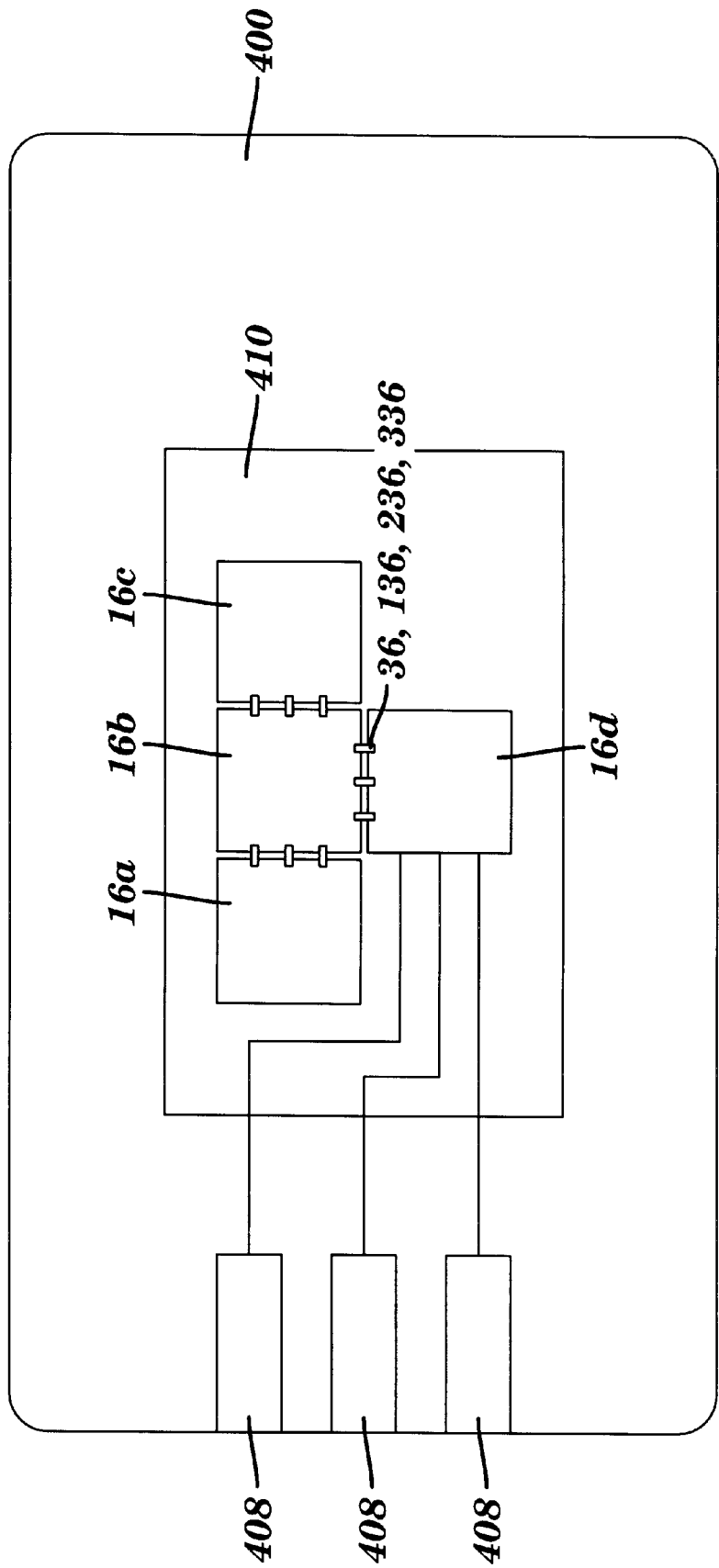
FIG. 35 depicts a top view of a device utilizing the chip-to-chip edge connections, in accordance with a preferred embodiment of the present invention.

The chip edge interconnection of the present invention may be incorporated into a device 400, such as a smart card, a charge coupled device camera, an optical sensor, and a large-field radiation detector as illustrated in FIG. 35. In particular, the device 400 includes a plurality of chips 16a, 16b, 16c, 16d, such as a NVRAM, a microprocessor, a random-access memory (RAM), input/output (I/O) circuits, etc., within a cavity 410. The chips 16a, 16b, 16c, 16d are connected to one another by a plurality of interconnections or connections 36, 136, 236, or 336 formed therebetween. The chips 16a, 16b, 16c, 16d are then electrically connected to a plurality of terminals 408. It should also be noted that the interconnect method of the present invention allows for the combination of non-volatile memory, conventional random access memory (RAM), and a microprocessor in the same smart card package.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

We claim:

1. A semiconductor chip connection structure, comprising:

an opening formed by a recess within an edge of a first chip and an edge of a second chip, wherein each recess includes a conductive area and sloped sides, and wherein a dicing channel separates the first and second chips and a midpoint of the opening is offset from a midpoint of the dicing channel; and a connection between the conductive areas of the first and second chips.

2. The chip connection structure of claim 1, wherein a first surface adjacent the recess of each of the fist and second chips mate such that the recess of the first chip aligns with the recess of the second chip.

3. The chip connection structure of claim 1, wherein the sloped sides are sloped in the range of approximately 45 to 55 degrees.

4. The chip connection structure of claim 1, wherein the conductive area comprises metal.

5. The chip connection structure of claim 1, further including: a dielectric stack over the conductive area.

6. The chip connection structure of claim 5, wherein the dielectric stack comprises at least one layer of one of the following materials: an oxide, nitride and/or polyimide.

7. The chip connection structure of claim 1, wherein the connection is covered by an encapsulant.

8. The chip connection structure of claim 7, wherein the encapsulant comprises polyimide material.

9. The chip connection structure of claim 1, wherein the conductive area within the recess includes a nonconductive region and a conductive region over the non-conductive region.

10. The chip connection structure of claim 1, wherein the connection is comprised of an electrically conductive material.

11. The chip connection structure of claim 1, wherein a dielectric layer is formed on at least one of the edges of the first or second chips below the opening, the dielectric layer electrically isolating the edges of the first and second chips below the opening.

12. The chip connection structure of claim 9, wherein the non-conductive region comprises an oxide.

13. The chip connection structure of claim 9, wherein the conductive region of the conductive sloped side is selected from the group consisting of: solder, conductive paste and PMC.

14. A device including at least two chips connected via an edge connection, wherein the edge connection further includes an opening formed by a recess within the edge of the at least two chips, wherein each recess includes a conductive area and sloped sides, and wherein a dicing channel separates the at least two chips and a midpoint of the opening is offset from a midpoint of the dicing channel.

15. The device of claim 14, wherein the device is a low-profile electronic device.

16. The device of claim 14, wherein the conductive sloped side within the recess further includes a non-conductive region and a conductive region over the non-conductive region.

* * * * *